(12) United States Patent
Giefers et al.

(10) Patent No.: US 10,776,118 B2
(45) Date of Patent: Sep. 15, 2020

(54) INDEX BASED MEMORY ACCESS USING SINGLE INSTRUCTION MULTIPLE DATA UNIT

(71) Applicant: International Business Machines Corporation, Armonk, NY (US)

(72) Inventors: Heiner Giefers, Langnau am Albis (CH); Raphael Polig, Dietikon (CH); Jan Van Lunteren, Gattikon (CH)

(73) Assignee: International Business Machines Corporation, Armonk, NY (US)

( * ) Notice: Subject to any disclaimer, the term of this patent is extended or adjusted under 35 U.S.C. 154(b) by 69 days.

(21) Appl. No.: 15/261,216

(22) Filed: Sep. 9, 2016

(65) Prior Publication Data

US 2018/0074962 A1    Mar. 15, 2018

(51) Int. Cl.
| | |
|---|---|
| *G06F 9/345* | (2018.01) |
| *G06F 9/35* | (2018.01) |
| *G06F 9/30* | (2018.01) |
| *G06F 12/06* | (2006.01) |
| *G06F 12/0802* | (2016.01) |

(Continued)

(52) U.S. Cl.
CPC .......... *G06F 9/345* (2013.01); *G06F 9/30036* (2013.01); *G06F 9/30043* (2013.01); *G06F 9/30018* (2013.01); *G06F 12/0879* (2013.01); *G11C 5/02* (2013.01)

(58) Field of Classification Search
CPC ...... G06F 12/00; G06F 12/06; G06F 12/0802; G06F 12/0615; G06F 9/00; G06F 9/30018; G06F 9/30036; G06F 9/30032; G06F 9/30043; G06F 9/345; G06F 9/35; G11C 5/02

See application file for complete search history.

(56) References Cited

U.S. PATENT DOCUMENTS 5,375,216 A * 12/1994 Moyer ................ G06F 9/30043
711/123
6,658,537 B2    12/2003 Hughes et al.
(Continued)

FOREIGN PATENT DOCUMENTS

EP          1 787 193 B1    12/2014
WO    WO 2014/178846 A1    11/2014

OTHER PUBLICATIONS

David Patterson and John Hennessy, "Computer Architecture A Quantitative Approach", 1990, Morgan Kaufmann, pp. 18-20 and 251.*

(Continued)

*Primary Examiner* — Aimee Li
*Assistant Examiner* — Courtney P Carmichael-Moody
(74) *Attorney, Agent, or Firm* — Scully, Scott, Murphy & Presser, P.C.; Daniel P. Morris, Esq.

(57) ABSTRACT

A computing system comprising a central processing unit (CPU), a memory processor and a memory device comprising a data array and an index array. The computing system is configured to store data lines comprising data elements in the data array and to store index lines comprising a plurality of memory indices in the index array. The memory indices indicate memory positions of data elements in the data array with respect to a start address of the data array. There is further provided a related computer implemented method and a related computer program product.

17 Claims, 9 Drawing Sheets

(51) Int. Cl.
 *G11C 5/02* (2006.01)
 *G06F 12/0879* (2016.01)

(56) References Cited

U.S. PATENT DOCUMENTS

| | | | | |
|---|---|---|---|---|
| 6,665,790 | B1* | 12/2003 | Glossner, III | G06F 9/30036 |
| | | | | 712/22 |
| 8,661,167 | B2 | 2/2014 | Hsin et al. | |
| 9,146,774 | B2 | 9/2015 | Busaba et al. | |
| 2004/0260884 | A1* | 12/2004 | Poznanovic | G06F 9/3455 |
| | | | | 711/137 |
| 2005/0262276 | A1 | 11/2005 | Singh et al. | |
| 2007/0162643 | A1* | 7/2007 | Tousek | G06F 13/1642 |
| | | | | 710/22 |
| 2007/0255903 | A1* | 11/2007 | Tsadik | G06F 9/383 |
| | | | | 711/118 |
| 2012/0060015 | A1* | 3/2012 | Eichenberger | G06F 15/8069 |
| | | | | 712/4 |
| 2013/0326160 | A1* | 12/2013 | Sperber | G06F 9/30036 |
| | | | | 711/154 |
| 2014/0208156 | A1* | 7/2014 | Muralimanohar | G11C 8/12 |
| | | | | 714/6.24 |
| 2015/0347475 | A1* | 12/2015 | Kimura | G06F 17/30306 |
| | | | | 707/752 |
| 2016/0306566 | A1* | 10/2016 | Lu | G06F 13/385 |
| 2017/0371791 | A1* | 12/2017 | Ranjan | G06F 12/0862 |

OTHER PUBLICATIONS

Toledo, "Improving the memory-system performance of sparse-matrix vector multiplication", Browse Journals & Magazines, IBM Journal of Research and Development, vol. 41, Issue 6, Issue Date: Nov. 1997, Abstract Only, last downloaded Aug. 9, 2016; URL:http://ieeexplore.ieee.org/xpl/login.jsp?tp=&arnumber=5389359&url=http%3A%2F%2Fieeexplore.ieee.org%2Fxpls%2Fabs_all.jsp%3Farnumber%3D5389359.

\* cited by examiner

INDEX BASED MEMORY ACCESS USING SINGLE INSTRUCTION MULTIPLE DATA UNIT

BACKGROUND

The disclosure relates to a computing system comprising a central processing unit (CPU), a memory processor and a memory device.

Many computer programs rely on loops which do not rely on a linear index increase but rather operate on a list of indices. One example is a sparse-matrix-vector multiplication.

Accordingly there is a need for computing systems adapted to run such index based computer programs.

SUMMARY

According to a first aspect, the invention is embodied as a computing system comprising a central processing unit (CPU), a memory processor and a memory device comprising a data array and an index array. The computing system is configured to store data lines comprising data elements in the data array and to store index lines comprising a plurality of memory indices in the index array. The memory indices indicate memory positions of the data elements in the data array with respect to a start address of the data array.

According to an embodiment of another aspect of the invention a computer implemented method is provided for operating a computing system according to the first aspect. The computing system comprises a central processing unit, a memory processor and a memory device comprising a data array and an index array. The method comprises steps of storing data lines comprising data elements in the data array and storing index lines comprising a plurality of memory indices in the index array. The memory indices indicate memory positions of the data elements in the data array with respect to a start address of the data array.

Another aspect of the invention relates to a computer program product for operating a computing system according to the first aspect. The computing system comprises a central processing unit, a memory processor and a memory device comprising a data array and an index array. The computer program product comprises a computer readable storage medium having program instructions embodied therewith, the program instructions executable by the memory processor of the computing system to cause the memory processor to perform a method comprising storing data lines comprising data elements in the data array and storing index lines comprising a plurality of memory indices in the index array. The memory indices indicate memory positions of the data elements in the data array with respect to a start address of the data array.

Embodiments of the invention will be described in more detail below, by way of illustrative and non-limiting examples, with reference to the accompanying drawings.

DETAILED DESCRIPTION

In reference to FIGS. 1-9, some general aspects and terms of embodiments of the invention are described.

In the context of this description, the following conventions, terms and/or expressions may be used:

The term memory processor may denote a dedicated processor for performing specific processing tasks. In contrast to a classical general purpose processor, the memory processor may be tightly integrated with, and be part of a memory unit. The memory processor may be located physically very close to and/or inside the memory unit. The memory processor may be in particular adapted to perform index based memory operations.

The term memory device may denote a memory of the computing system. The memory device may comprise e.g. DRAM memory cells. However, other technologies, e.g., SRAM or memristors, may also be used. The memory device may be in particular adapted to perform read and write operations line by line, i.e. complete data lines are written to the memory device and read by the memory device as data bursts.

The proposed computing system may be implemented in particular for applications requiring calculations that are highly repetitive, like, e.g. in sparse matrix multiplications.

Embodiments of the invention provide a set of memory instructions which perform indirect memory operations based on an index stored in a memory device. These memory instructions may trigger multiple read or write commands on a memory processor which is located close to the memory device. The memory processor is configured to handle the read and write operations. The memory processor assembles data elements of the memory device before sending it to a central processing unit (CPU), or before writing data elements to the memory devices. According to embodiments of the invention, the number of data transfers can be reduced. Furthermore, a Single Input Multiple Data (SIMD) unit may pick up the data elements as soon as they arrive at the CPU.

Figure 1:
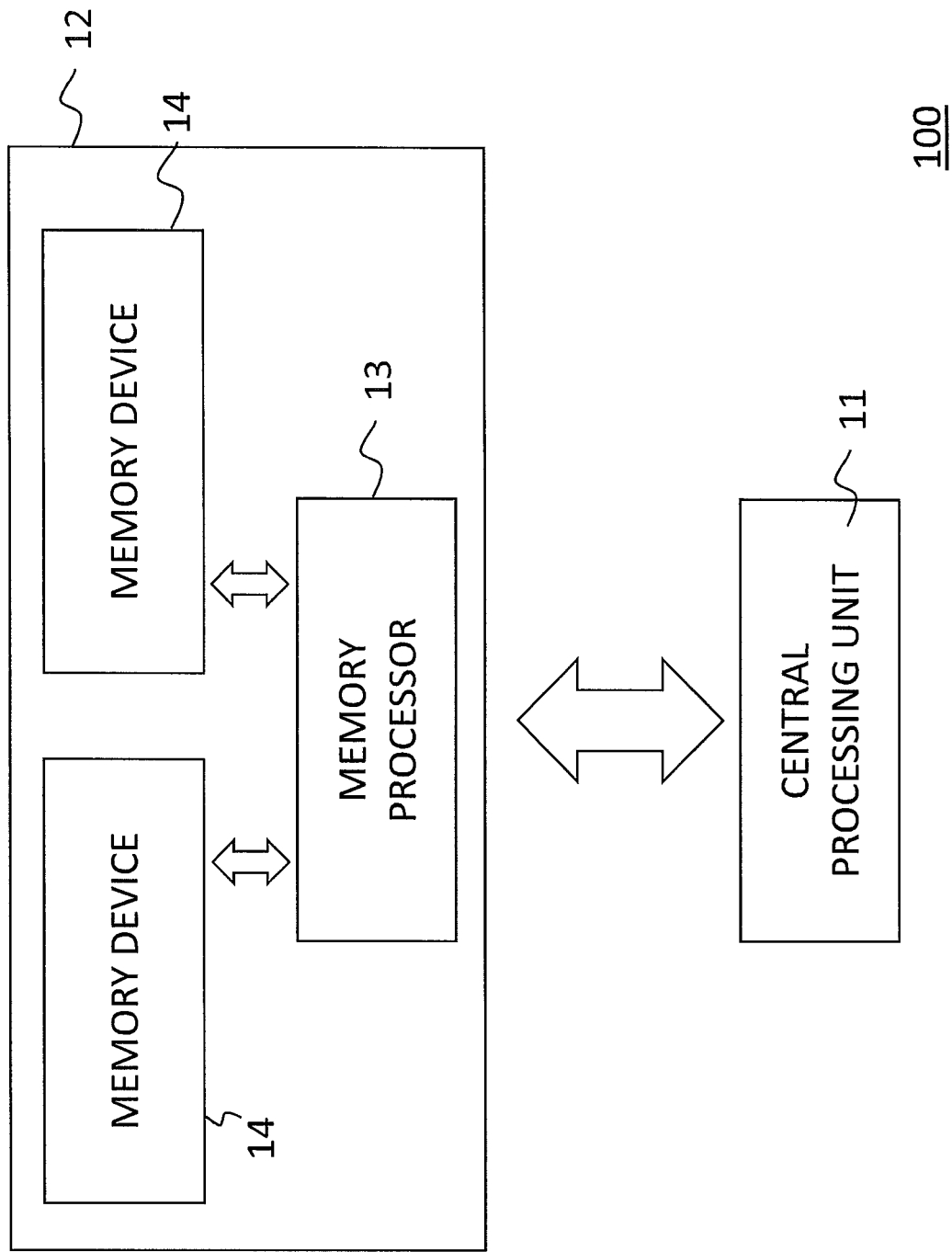
FIG. 1 shows a block diagram of a computing system according to an embodiment of the invention.

FIG. 1 shows a block diagram of a computing system 100 according to an embodiment of the invention. The computing system 100 comprises a central processing unit (CPU) 11 and a memory unit 12. The memory unit 12 comprises a memory processor 13 and one or more memory devices 14. The memory devices 14 may be e.g. embodied as Dynamic Random Access (DRAM) device.

Figure 2:
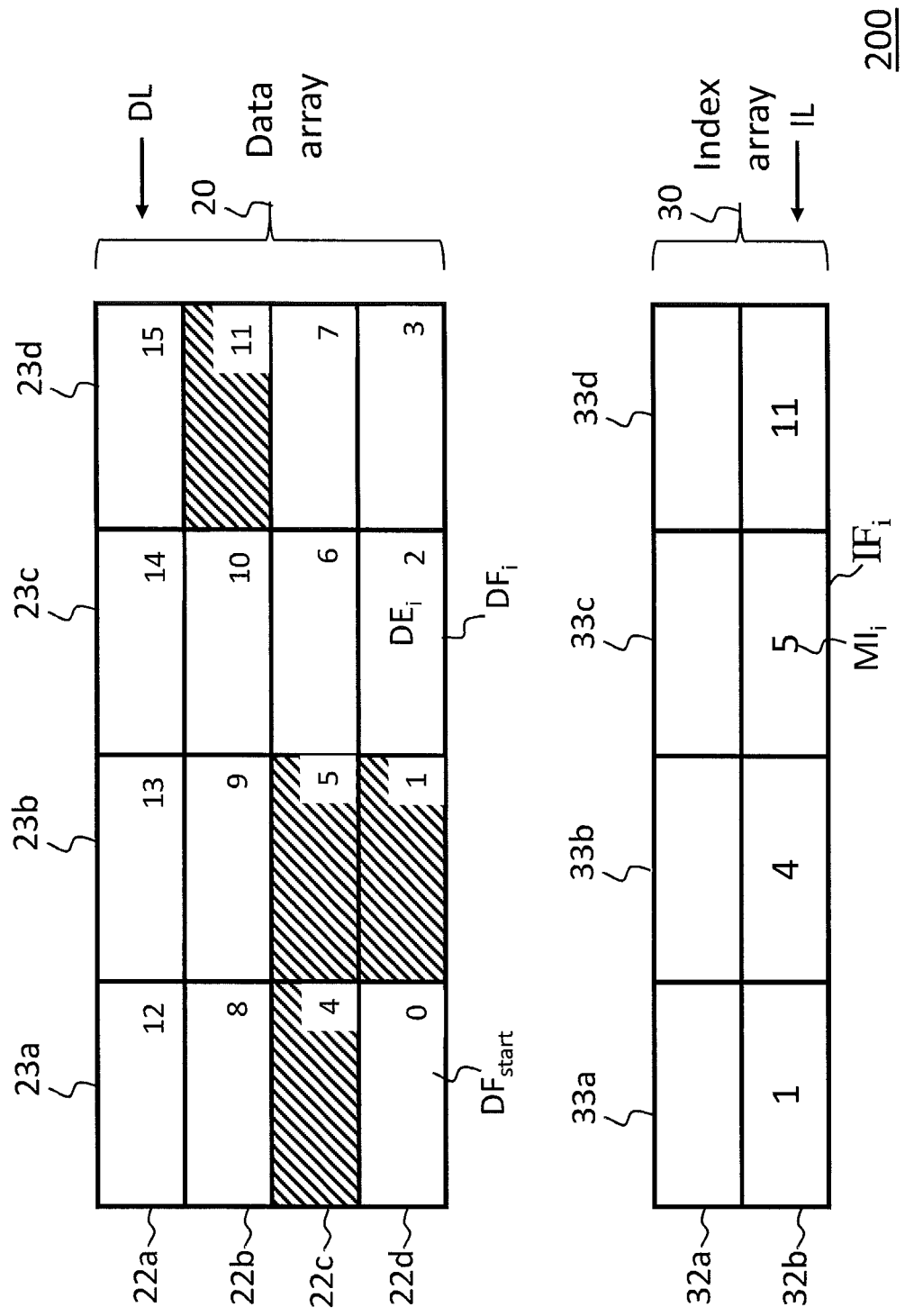
FIG. 2 shows an exemplary memory structure of a memory device according to an embodiment of the invention.

FIG. 2 shows an exemplary memory structure 200 of the memory devices 14 of FIG. 1. The memory structure 200 comprises a data array 20 and an index array 30. The memory structure 200 comprises data lines DL for storing data elements $DE_i$ in the data array 20. In this example data lines 22*a*, 22*b*, 22*c* and 22*d* are shown. The data lines may also be denoted as data rows. The data array 20 further comprises a plurality of data columns. In this example data columns 23a, 23b, 23c and 23d are shown. The data array 20 comprises a plurality of data fields $DF_i$ for storing the data elements $DE_i$ in the data array 20.

The memory device 14 is configured to write and read the data lines DL in a burst mode operation as data bursts. The respective data bursts comprise data elements $DE_i$ of a complete data line DL.

The memory structure 200 further comprises index lines IL for storing memory indices $MI_i$ in the index array 30. In this example index lines 32a and 32b are shown. The index lines may also be denoted as index rows. The index array 30 further comprises a plurality of index columns. In this example index columns 33a, 33b, 33c and 33d are shown. The index array 30 comprises a plurality of index fields IF, for storing the memory indices $MI_i$. In this example the memory indices "1", "4", "5" and "11" are stored in the index line 32b.

The memory indices "1", "4", "5" and "11" indicate memory positions of data elements $DE_i$ in the data array 20 with respect to a start address of the data array 20. In this example the start address is the address of the data field $DF_{Start}$. This is the first data field of the data line 22d, i.e. the data field of the column 23a of the data line 22d. The start address serves as reference address for the memory indices. In this example it is assumed that the data fields $DF_i$ are ordered in an increasing manner with respect to the data field $DF_{Start}$. Accordingly, the data field $DF_{Start}$ is numbered with 0 and the neighboring fields of the data line 22d with 1, 2 and 3. In a corresponding manner the data fields $DF_i$ of the data line 22c are numbered from left to right with 4, 5, 6 and 7. In a corresponding manner the data fields $DF_i$ of the data line 22b are numbered from left to right with 8, 9, 10 and 11. And finally the data fields $DF_i$ of the data line 22a are numbered from left to right with 12, 13, 14 and 15. The numbering indicates memory positions of data elements $DE_i$ in the data array 20 with respect to the start address of the data field $DF_{Start}$.

Accordingly, the memory indices "1", "4", "5" and "11" of the index line 32b indicate to the memory processor 13 that the data elements $DE_i$ of the index line 32b are stored in the data fields $DF_i$ that are numbered with 1, 4, 5 and 11. These data fields are illustrated with a diagonal pattern.

Figure 3:
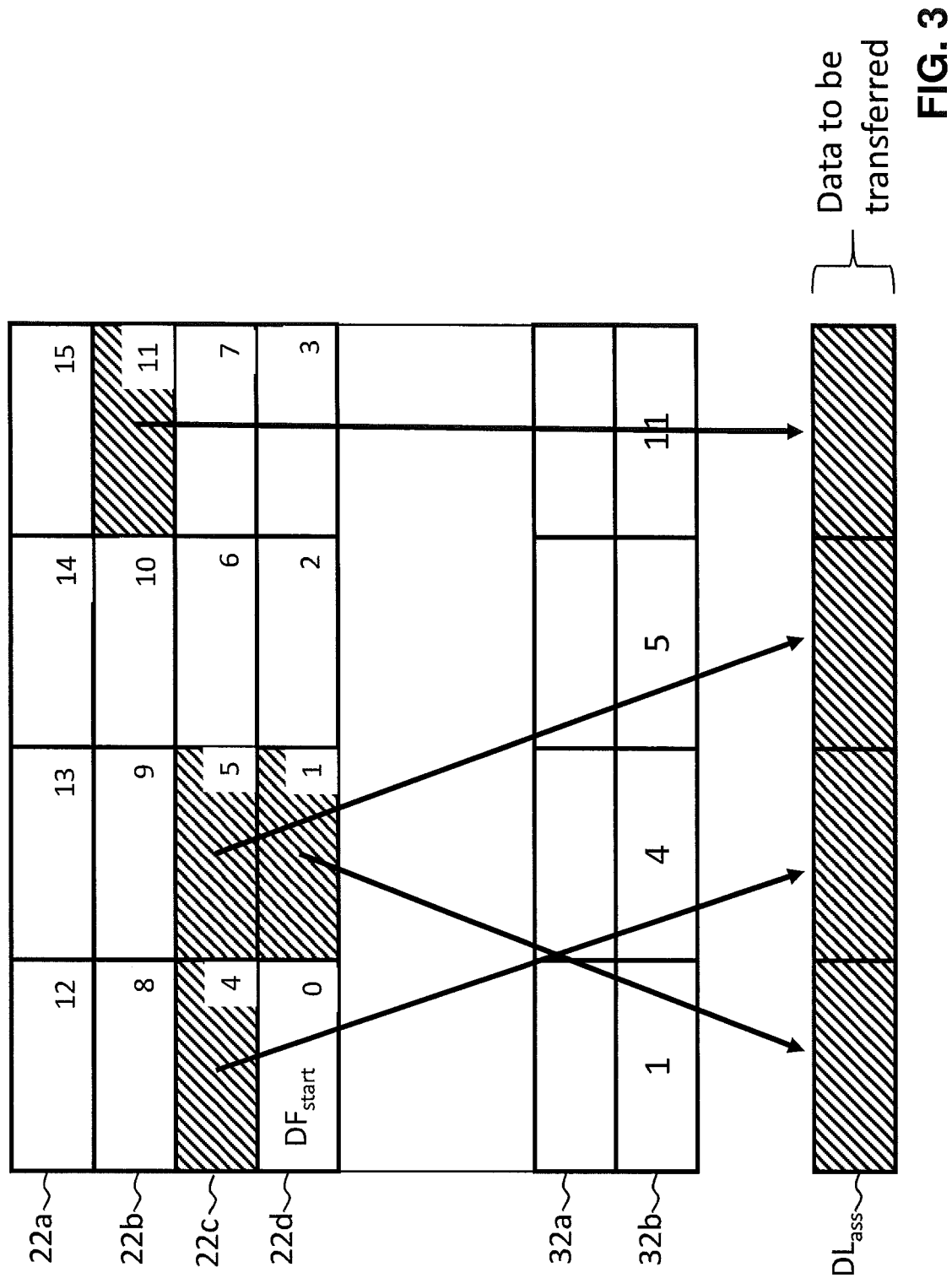
FIG. 3 illustrates an example of the processing of an exemplary read request.

FIG. 3 illustrates an example of an exemplary read request. It is assumed that the CPU 11 has sent a read request to the memory unit 12. The read request comprises as index line address the address of the index line 32b, or more particularly the address of the first index field of the index line 32b.

Furthermore, the read request comprises as start address the address of the data line 22d or more particularly the address of the first data field $DF_{start}$ of the data line 22d. The read request may be in particular embodied as burst request. Based on the read request the memory processor 13 can retrieve the data elements requested by the read request. Accordingly the memory processor 13 reads at first the index line 32b and thereby gets the memory indices $MI_i$ stored in the index line 32b. In this example the memory indices are "1", "4", "5" and "11". With the memory indices $MI_i$ and the start address of the data field $DF_{start}$, the memory processor 13 can compute the corresponding addresses and positions respectively of the data elements $DE_i$ requested by the read request. In this example the data elements $DE_i$ that correspond to the read request are stored in the data fields that are illustrated with a diagonal pattern and that are numbered with 1, 4, 5 and 11. These data elements $DE_i$ correspond to the memory indices 1, 4, 5 and 11 of the index line 32b.

The memory processor 13 retrieves then the data elements DEi and assembles them in the desired order into an assembled data line $DL_{ass}$. As the memory device 14 is operated in a burst mode that only allows to read full data lines, the memory processor 13 performs three consecutive reads of the data lines 22d, 22c and 22b. This means that also data elements $DE_i$ are read that do not correspond to memory indices of the current index line 32b. In this example these "unwanted" data elements are the date elements in the "white" data fields numbered 0, 2, 3, 6 7, 8, 9 and 10. Accordingly the data elements $DE_i$ of the white data fields $DF_i$ are discarded by the memory processor 13 and only the data elements $DE_i$ of the data fields illustrated with a diagonal pattern and numbered 1, 4, 5 and 11 are assembled into the data line $DL_{ass}$. In other words, the memory processor 13 sorts the wanted data elements $DE_i$ of the data fields $DF_i$ illustrated with a diagonal pattern in accordance with the memory indices $MI_i$ of the index line 32b and discards the "white" data elements $DE_i$ of the data lines 22d, 22c and 22b that do not correspond to the memory indices "1", "4", "5" and "11" of the index line 32b.

Then in a subsequent step the memory processor 13 may send the assembled data line $DL_{ass}$ to the CPU 11. The data line $DL_{ass}$ may be in particular send as data burst to the CPU 11. Accordingly the CPU 11 does only receive the desired and requested data elements $DE_i$, but no unwanted data elements stored in the white data fields $DF_i$. This facilitates a single-instruction multiple-data (SIMD) operation of the CPU 11.

Figure 4:
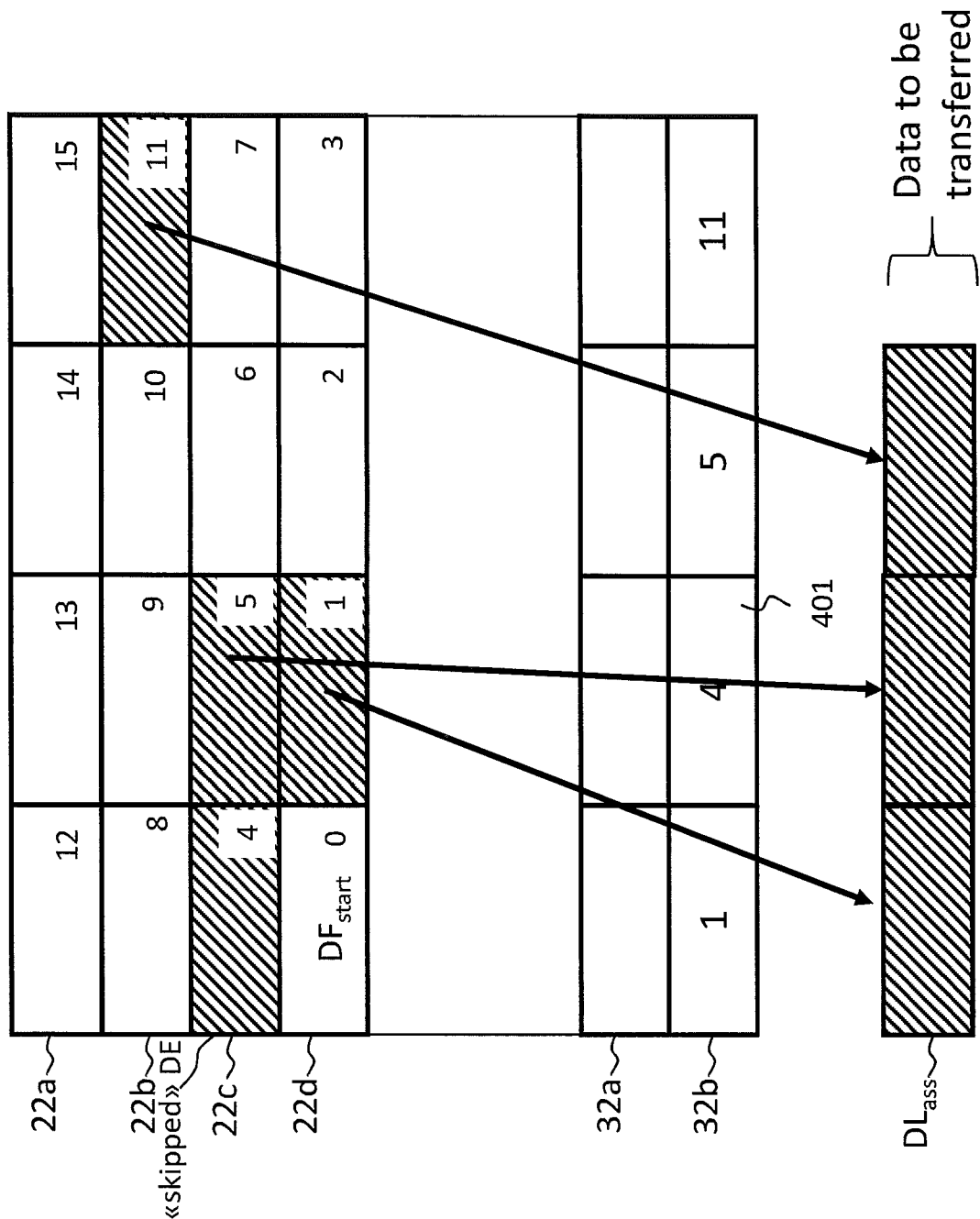
FIG. 4 illustrates an example of the processing of a read request comprising mask bits.

According to embodiments as illustrated with reference to FIG. 4, the read request may comprise one or more mask bits in addition to the index line address and the start address. The mask bits indicate to the memory processor 13 that data elements $DE_i$ that correspond to the mask bits shall be skipped. According to the example of FIG. 4 it is assumed that the read request comprises the address of the index line 32b, the start address of the data line 22d and a mask bit that indicates that the memory index "4" of the second index field 401 of the index line 32b is not needed and shall hence be skipped. Accordingly, only the data elements $DE_i$ of the data fields $DF_i$ numbered with 1, 5 and 11 are assembled by the memory processor 13 into the assembled data line $DL_{ass}$ and then send to the CPU 11.

Figure 5:
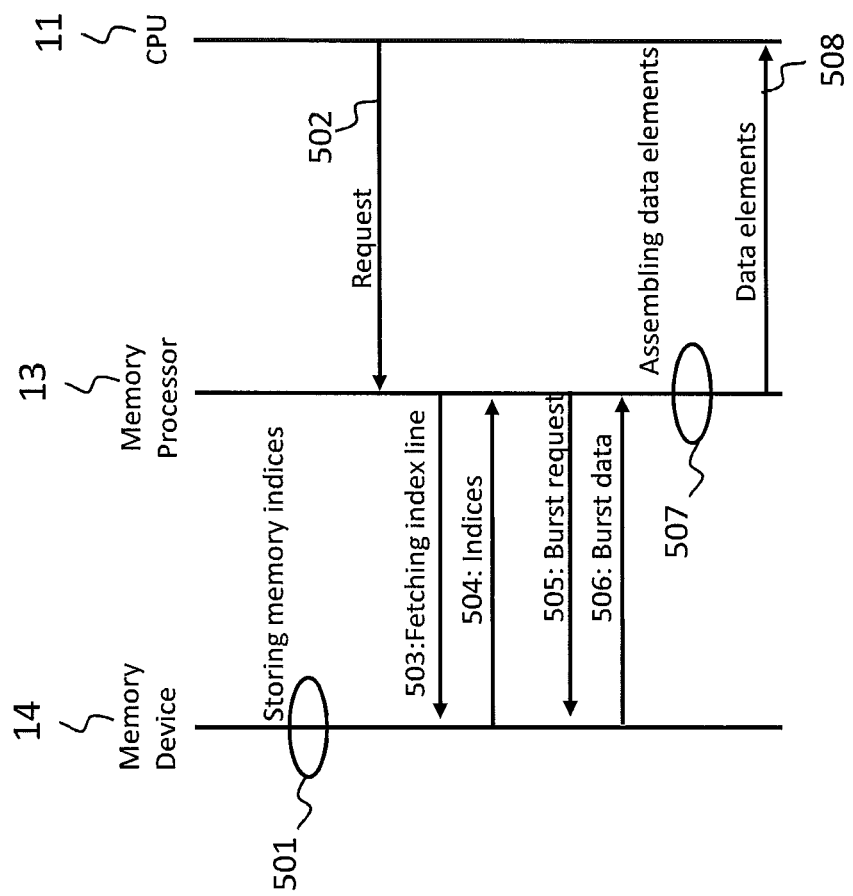
FIG. 5 shows method steps of a computer implemented method for performing a read operation according to embodiments of the invention.

FIG. 5 shows method steps of a computer implemented method for operating a computing system, e.g. the computing system 100 of FIG. 1. More particularly, FIG. 5 shows method steps of a read operation of the computing system 100. In an initial operation step 501, which may also be denoted as an initial configuration step 501, a plurality of index lines are stored in the index array 30 of the memory device 14. This may be e.g. performed when a corresponding index based program is installed on the computing system 100. An index based program is a program that uses memory indices for read and write operations from/to the memory device 14. As a result, the memory device 14 comprises an index array 30 having a plurality of index lines comprising memory indices that can be used by an index based program running on the CPU 11.

Then at a step 502 the CPU 11 sends a read request to the memory processor 13. The read request comprises an index line address and a start address.

At a step 503, the memory processor 13 fetches an index line corresponding to the index line address from the index array 30 of the memory device 20.

At a step 504 the memory processor 13 receives the index line comprising the memory indices from the memory device 14.

At a step 505, the memory processor 13 sends a read request as burst request to the memory device 14. In the example of FIG. 3, the read request would comprise a read request for the data lines 22d, 22c and 22b.

At a step 506, the memory processor 13 receives the complete data lines 22d, 22c and 22b as burst data. The received burst data includes the "white" data fields that are not desired according to the read request of the CPU 11 as well as the desired data fields that correspond to the read request of the CPU.

Hence as a result of the steps 505 and 506 the memory processor 13 has retrieved the data elements that correspond to the memory indices of the respective index line.

At a step 507, the memory processor 13 assembles the desired data elements that correspond to the memory indices of the respective index line (diagonally patterned data fields in FIGS. 2, 3 and 4) into an assembled data line. This includes sorting the data elements in accordance with the indices of the respective index line and discarding the not desired data elements that do not correspond to the memory indices (white data fields FIGS. 2, 3 and 4).

At a step 508, the memory processor 13 sends the assembled data elements to the CPU 11.

Figure 6:
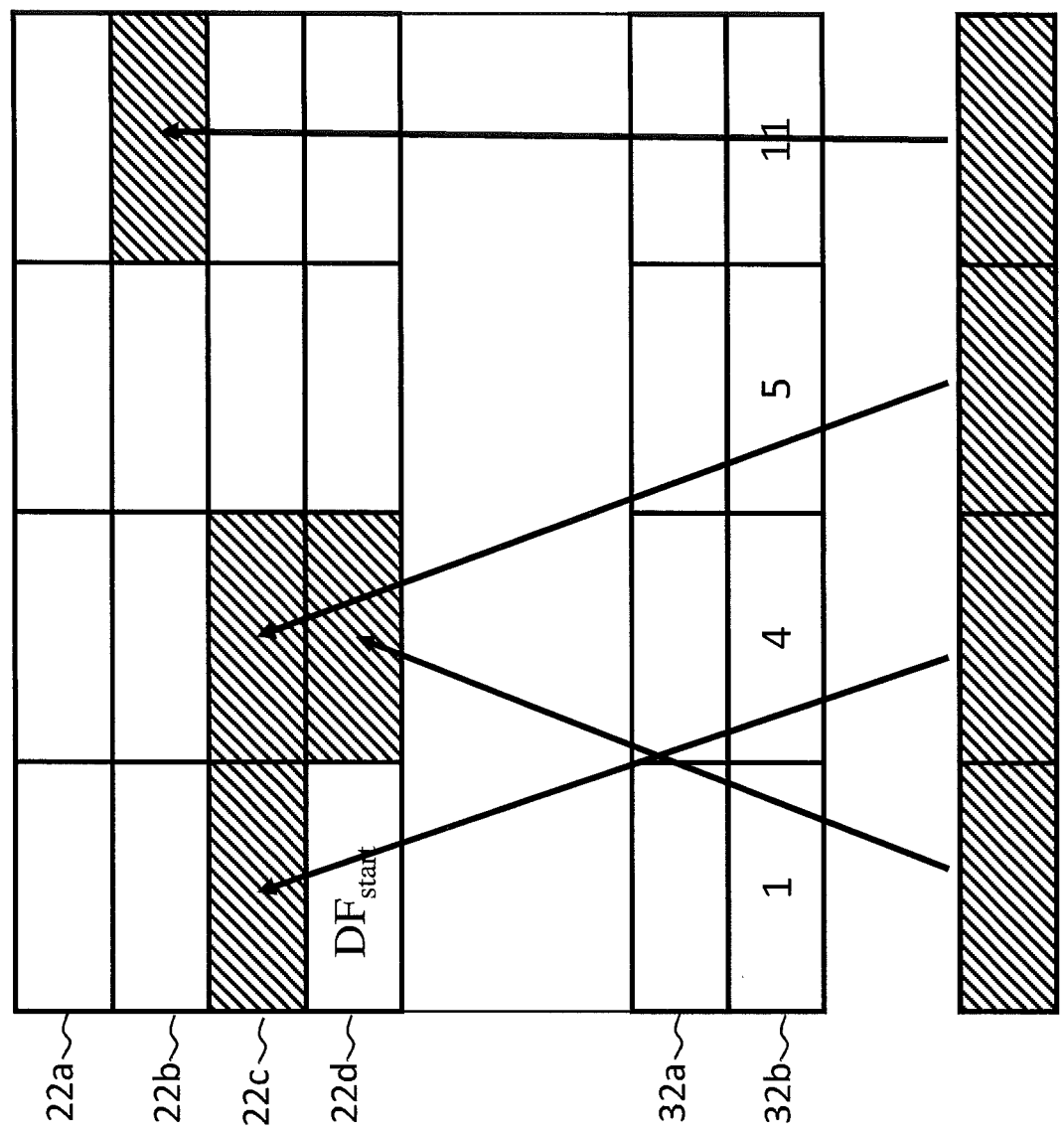
FIG. 6 illustrates an example of the processing of an exemplary write request.

FIG. 6 illustrates an example of an exemplary write request. It is assumed that the CPU 11 has sent a write request to the memory processor 13. The write request comprises a set of data elements $DE_i$ the index line address of the index line 32b and the start address of the data field $DF_{start}$.

Accordingly the memory processor 13 reads at first the index line 32b and thereby gets the memory indices $MI_i$ stored in the index line 32b. In this example the memory indices are "1", "4", "5" and "11". With the memory indices $MI_i$ and the start address of the data field $DF_{start}$, the memory processor 13 can compute the corresponding addresses and positions respectively of the data elements $DE_i$ to be written into the memory device 14. Accordingly the memory processor 13 has to perform three consecutive data line write operations to the data lines 22d, 22b and 22d. The memory processor 13 disassembles the data elements $DE_i$ received from the CPU 11 into three data lines. This means the memory processor 13 places the received data elements $DE_i$ into their desired position in the corresponding data line. Then it performs three consecutive write operations to write the disassembled data elements $DE_i$ into their corresponding data fields $DF_i$ (illustrated with a diagonal pattern) of the data lines 22d, 22c and 22b. In other words, the memory processor 13 disassembles the data elements $DE_i$ by sorting the data elements in accordance with the indices of the index line 32b. Preferably the memory processor 13 writes the data lines comprising the data elements $DE_i$ as data bursts to the data array 30 of the memory device 14. As a result of the write operation, the computing system stores the data lines 22d, 22c and 22b comprising the data elements $DE_i$ in the data array 20.

Figure 7:
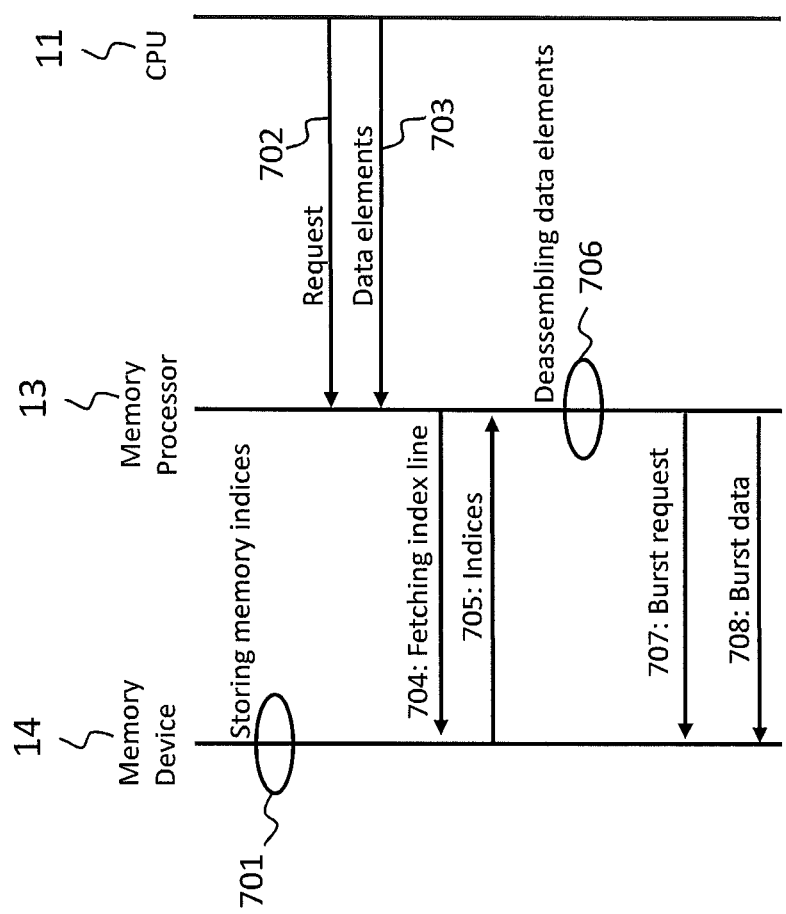
FIG. 7 shows method steps of a write operation of a computing device according to embodiments of the invention.

FIG. 7 shows method steps of a write operation of the device 100. It is assumed that in an initial configuration step 701, a plurality of index lines are stored in the index array 30 of the memory device 14 as already explained with reference to FIG. 5.

Then at a step 702 the CPU 11 sends a write request to the memory processor 13. The write request comprises an index line address and a start address.

At a step 703, the CPU 11 sends as data a set of data elements that shall be written to the memory device 14 to the memory processor 13. It should be noted that according to embodiments a combination of the steps 702 and 703 is commonly referred to as write request.

At a step 704, the memory processor 13 fetches an index line corresponding to the index line address from the index array 30 of the memory device 20.

At a step 705 the memory processor 13 receives the index line comprising the memory indices from the memory device 14. Hence as a result of the steps 704 and 705 the memory processor 13 has retrieved the memory indices of the respective index line.

At a step 706, the memory processor 13 computes the corresponding addresses and positions respectively of the data elements $DE_i$ to be written into the memory device 14 and disassembles the data elements $DE_i$ into data lines corresponding to the desired positions of the data elements $DE_i$ of the data array 30 as indicated by the memory indices and the start address.

At a step 707 the memory processor 13 sends a write burst request to the memory device 14. Then at a step 708 the memory processor 13 sends one or more data lines, e.g. the data lines 22d, 22c and 22b, of FIG. 6 as burst data to the memory device 14. Thereby it writes e.g. the data elements $DE_i$ received from the CPU 11 into their desired positions in the data array 20.

Figure 8:
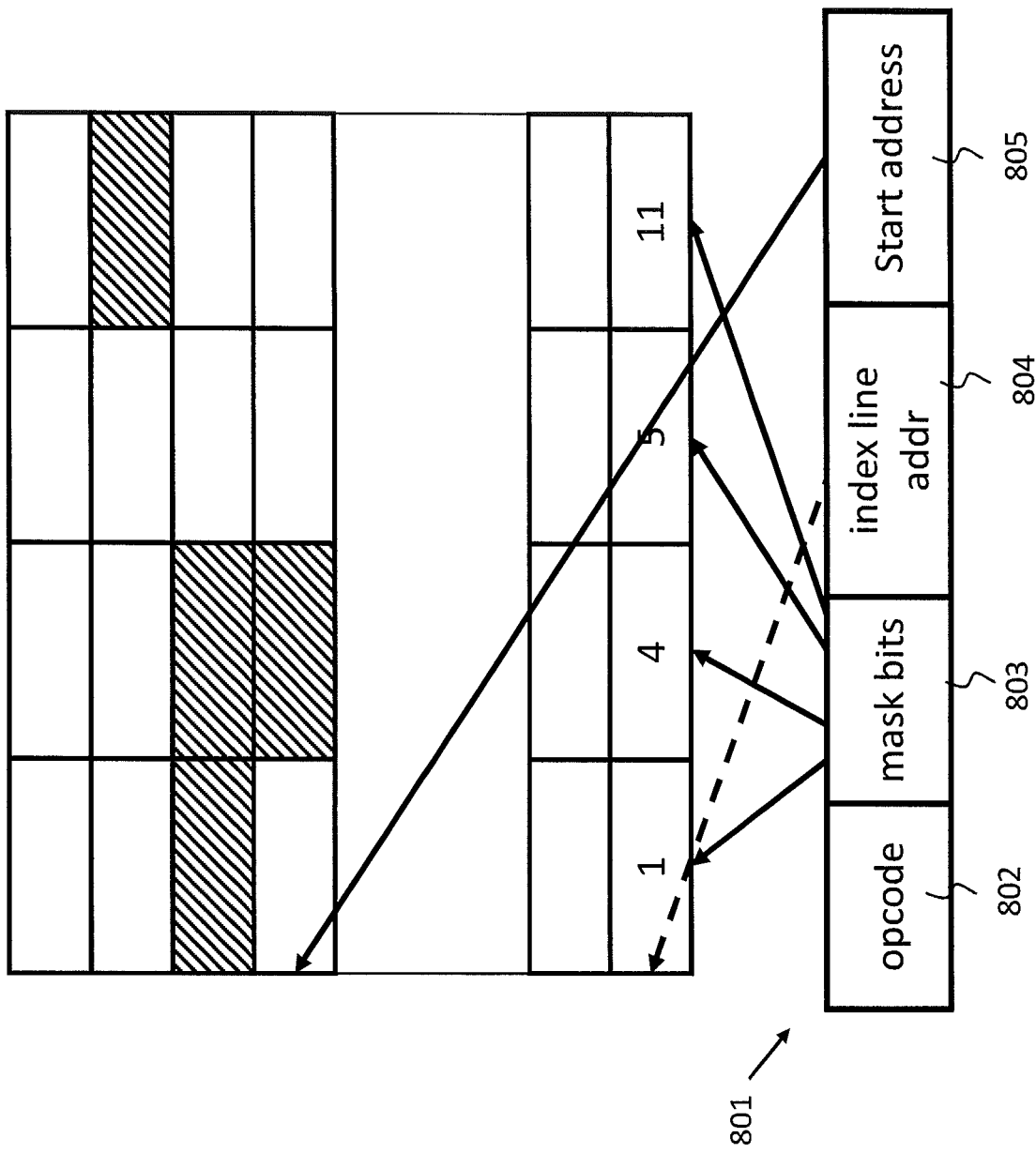
FIG. 8 illustrates an exemplary instruction format of read/write requests.

FIG. 8 illustrates an exemplary embodiment of write and read requests that may be sent from the CPU 11 to the memory processor 13.

The write and read requests have an instruction format 801. The instruction format 801 comprises operation code bits 802 that indicate whether a read operation or a write operation shall be performed. As an example, a "0" may indicate a write operation and a "1" may indicate a read operation. Furthermore, mask bits 803 are provided that indicate which data elements corresponding to an index row shall be read and written respectively. As an example, a mask bit "1" could indicate that the respective data element corresponding to the memory index shall be used, i.e. read or written from/to the memory device 14. On the contrary, a mask bit "0" could indicate that the respective data element corresponding to the memory index shall be skipped, i.e. not written or not read respectively.

Moreover, index line address bits 804 are provided that indicate the index line address of the respective index line. Finally start address bits 805 are provided that indicate the start address of the data field $DF_{start}$ in the data array 20.

Figure 9:
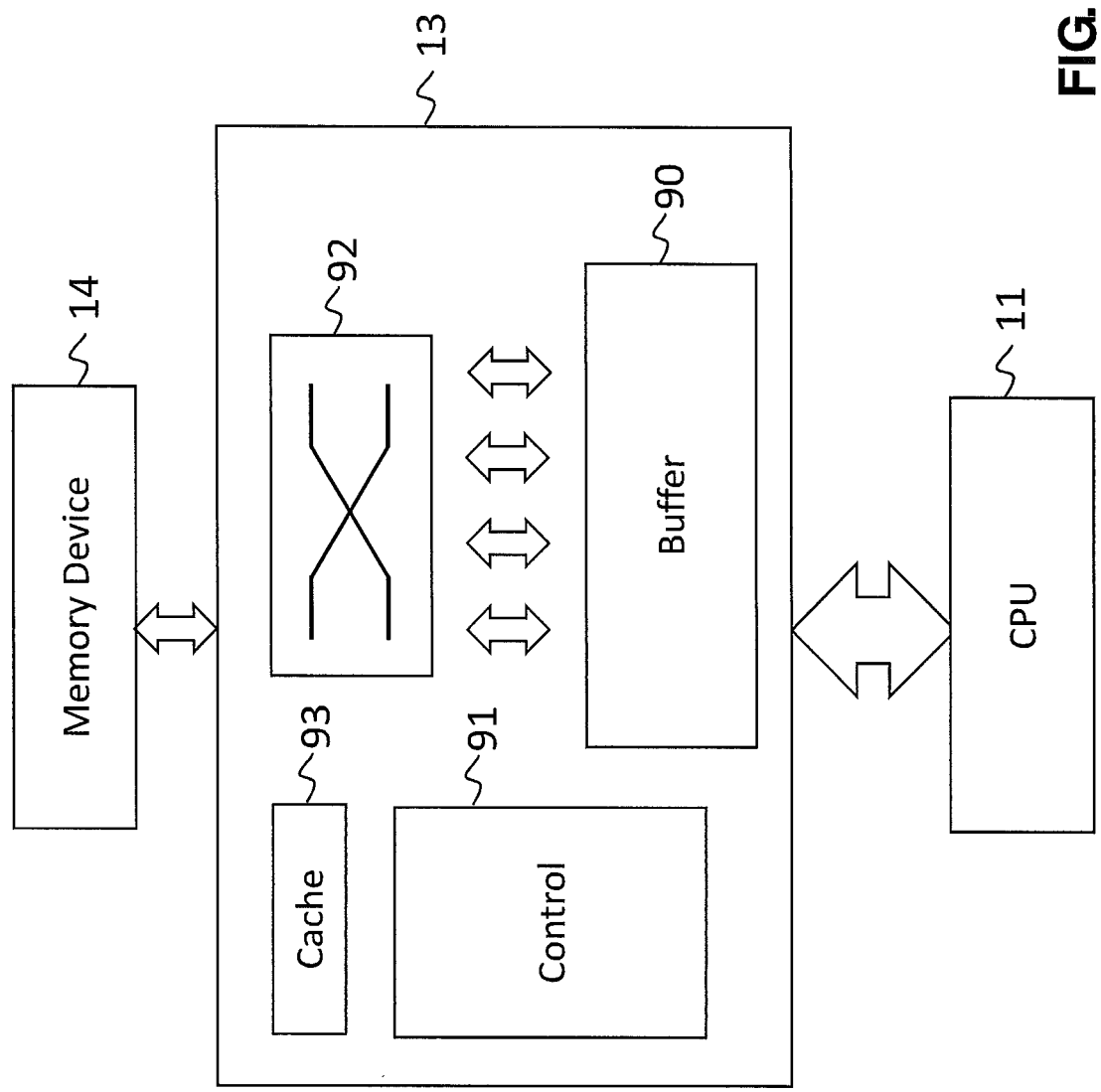
FIG. 9 shows a more detailed block diagram of a memory processor according to embodiments of the invention.

FIG. 9 shows a more detailed block diagram of the memory processor 13. The memory processor 13 comprises a buffer unit 90, a control unit 91 and a shuffling unit 92. The buffer unit 90 buffers the data elements to be written to the memory device 14 or to be send to the CPU 11. The shuffling unit 92 shuffles the data elements in order to assemble the data elements to be send to the CPU 11 or to disassemble the data elements to be written to the memory device 14. The shuffling unit 92 may be e.g. implemented as crossbar array. The memory processor 13 further comprises a cache unit 93. The cache unit 93 caches assembled data elements that are sent to the CPU 11. If the CPU 11 subsequently sends another read request that corresponds to the data elements stored in the cache, the memory processor 13 can send the cached data elements directly to the CPU 11 without accessing the memory device 14. The control unit 91 controls the operation of the memory processor 13.

Aspects of the invention may be embodied as a computer program product for operating the computing system 100.

The computer program product comprises a computer readable storage medium having program instructions embodied therewith. The program instructions may be executable by the memory processor 13 and/or the CPU 11 to cause the memory processor 13 and/or the CPU 11 to perform methods according to embodiments of the invention as described above.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computing system comprising:
a memory comprising a data array and an index array, wherein:
the data array comprises at least one data line, each data line comprises a set of data fields, each data field is configured to hold a data element, and each data field is indexed by a memory index;
the index array comprises at least one index line, each index line comprises a set of memory indices indicating memory positions of data elements in the data array with respect to a start data field of the data array, wherein the start data field is one particular data field in the data array;
when the computing system is in a burst mode of operation, data elements in the data array are accessed on a line-by-line basis, such that a read operation results in reading a complete data line, and a write operation results in writing to a complete data line;
a memory processor configured to be in communication with the memory, the memory processor comprising a buffer and a cache;
a hardware processor configured to be in communication with the memory processor, the hardware processor configured to send a read request for a set of requested data elements to the memory processor, wherein:
the read request includes an index line address and an address of the start data field of the data array, the index line address is an address of a requested index line among the index array; and
the requested index line includes memory indices of data fields that hold the set of requested data elements among the data array;
the memory processor is configured to:
receive the read request;
use the memory indices among the requested index line to identify a number of data lines that include the data fields holding the set of requested data elements, the identification comprises computing the memory positions of the set of requested data elements using the memory indices among the requested index line and the address of the start data field in the read request;
perform a number of read operations on the data array, that is equal to the number of identified data lines, to retrieve the number of identified data lines from the data array, wherein each identified data line includes at least one of the set of requested data elements, and includes unwanted data elements that are not requested in the read request;
store the retrieved data lines in the buffer;
discard the unwanted data elements among the retrieved data lines from the buffer, such that the set of requested data elements remain in the buffer;
assemble the remaining requested data elements in the buffer into an assembled data line;
store the assembled data line including the requested data elements in the cache; and
send the assembled data line to the hardware processor, wherein the memory processor is configured to send the assembled data line from the cache to the hardware processor in response to a subsequent read request for the requested data elements by the hardware processor.

2. The computing system according to claim 1, wherein the memory processor is configured to:
assemble the data elements by sorting the data elements in accordance with the memory indices of the requested index line of the index line address; and
discard the unwanted data elements by discarding data elements of the data lines that do not correspond to the memory indices of the requested index line of the index line address.

3. The computing system according to claim 1, wherein the hardware processor is further configured to:
send one or more mask bits to the memory processor, wherein the one or more mask bits indicate that data elements corresponding to the one or more mask bits shall be skipped.

4. The computing system according to claim 1, wherein the index line address in the read request is a first index line address, and the hardware processor is further configured to:
send a write request comprising a set of data elements, a second index line address and the start address to the memory processor;
wherein the memory processor is further configured to:
retrieve memory indices of the second index line address from the memory;
disassemble the data elements; and
write the disassembled data elements into the data array.

5. The computing system according to claim 4, wherein the memory processor is configured to write the data elements by:
sending a write burst request to the memory; and
write one or more data lines as data bursts to the memory.

6. The computing system according to claim 5, wherein the memory processor is configured to disassemble the data elements by:
sorting the data elements in accordance with the memory indices of an index line of the second index line address into one or more data lines.

7. The computing system according to claim 1, wherein a write request and the read request have an instruction format comprising:
operation code bits indicating whether a read operation or a write operation shall be performed;
index mask bits indicating which data elements corresponding to an index row shall be read and written respectively;
index address bits indicating the index line address; and
start address bits indicating the start address.

8. A computer implemented method for operating a computing system, the method comprising:
receiving, by a memory processor, a read request from a hardware processor, wherein the read request is for a set of data elements stored in a memory, and wherein:
the memory comprises a data array and an index array;
the data array comprises at least one data line, each data line comprises a set of data fields, each data field is configured to hold a data element, and each data field is indexed by a memory index;

the index array comprises at least one index line, each
index line comprises a set of memory indices indicating memory positions of data elements in the data array with respect to a start data field of the data array, wherein the start data field is one particular data field in the data array;

in a burst mode of operation, data elements in the data array are accessed on a line-by-line basis, such that a read operation results in reading a complete data line, and a write operation results in writing to a complete data line;

the read request includes an index line address and an address of the start data field of the data array, the index line address is an address of a requested index line among the index array;

the requested index line includes memory indices of data fields that hold requested data elements among the data array;

using, by the memory processor, the memory indices among the requested index line to identify a number of data lines that include the data fields holding the requested data element, the identification comprises computing the memory positions of the set of requested data elements using the memory indices among the requested index line and the address of the start data field in the read request;

performing, by the memory processor, a number of read operations on the data array, that is equal to the number of identified data lines, to retrieve the number of identified data lines from the data array, wherein each identified data line includes at least one of the requested data elements, and includes unwanted data elements that are not requested in the read request;

storing, by the memory processor, the retrieved data lines in a buffer of the memory processor;

discarding, by the memory processor, the unwanted data elements among the retrieved data lines from the buffer, such that the requested data elements remain in the buffer;

assembling, by the memory processor, the remaining requested data elements in the buffer into an assembled data line;

storing, by the memory processor, the assembled data line including the requested data elements in a cache of the memory processor; and sending, by the memory processor, the assembled data line to the hardware processor, wherein in response to receiving a subsequent read request for the requested data elements by the hardware processor, the method further comprising sending, by the memory processor, the assembled data line from the cache to the hardware processor.

9. The computer implemented method according to claim 8, further comprising:

assembling the data elements by sorting the data elements in accordance with the indices of the index line of the index line address; and discarding the unwanted elements by discarding data elements of the data lines that do not correspond to the indices of the index line of the index line address.

10. The computer implemented method according to claim 8, comprising:

receiving, by the memory processor, one or more mask bits in the read request, wherein the one or more mask bits indicate that data elements corresponding to the one or more mask bits shall be skipped.

11. The computer implemented method according to claim 8, wherein the index line address in the read request is a first index line address, and the method further comprising:

receiving, by the memory processor, a write request comprising a set of data elements, a second index line address and the start address;

retrieving, by the memory processor, the indices of the second index line address from the memory;

disassembling, by the memory processor, the data elements; and writing, by the memory processor, the disassembled data elements into the data array.

12. The computer implemented method according to claim 11, wherein writing the data elements comprises:

sending, by the memory processor, a write burst request to the memory device; and writing, by the memory processor, one or more data lines as data bursts to the memory device.

13. A computer program product for operating a computing system, the computer program product comprising a computer readable storage medium having program instructions embodied therewith, the program instructions executable by a memory processor of a device to cause the memory processor to:

receive a read request from a hardware processor, wherein the read request is for a set of data elements stored in a memory, and wherein:

the memory comprises a data array and an index array;

the data array comprises at least one data line, each data line comprises a set of data fields, each data field is configured to hold a data element, and each data field is indexed by a memory index;

the index array comprises at least one index line, each index line comprises a set of memory indices indicating memory positions of data elements in the data array with respect to a start data field of the data array, wherein the start data field is one particular data field in the data array;

in a burst mode of operation, data elements in the data array are accessed on a line-by-line basis, such that a read operation results in reading a complete data line, and a write operation results in writing to a complete data line;

the read request includes an index line address and an address of the start data field of the data array, the index line address is an address of a requested index line among the index array;

the requested index line includes memory indices of data fields that hold requested data elements among the data array;

use the memory indices among the requested index line to identify a number of data lines that include the data fields holding the requested data element, the identification comprises computing the memory positions of the set of requested data elements using the memory indices among the requested index line and the address of the start data field in the read request;

perform a number of read operations on the data array, that is equal to the number of identified data lines, to retrieve the number of identified data lines from the data array, wherein each identified data line includes at least one of the requested data elements, and includes unwanted data elements that are not requested in the read request;

store the retrieved data lines in a buffer of the memory processor;

discard the unwanted data elements among the retrieved data lines from the buffer, such that the requested data elements remain in the buffer;

assemble the remaining requested data elements in the buffer into an assembled data line;

store the assembled data line including the requested data elements in a cache of the memory processor; and send the assembled data line to the hardware processor, wherein in response to receiving a subsequent read request for the requested data elements by the hardware processor, send the assembled data line from the cache to the hardware processor.

14. The computer program product of claim 13, wherein the program instructions are further executable by the memory processor of the device to cause the memory processor to:

assemble the data elements by sorting the data elements in accordance with the indices of the index line of the index line address; and discard the unwanted elements by discarding data elements of the data lines that do not correspond to the indices of the index line of the index line address.

15. The computer program product of claim 13, wherein the program instructions are further executable by the memory processor of the device to cause the memory processor to:

receive one or more mask bits in the read request, wherein the one or more mask bits indicate that data elements corresponding to the one or more mask bits shall be skipped.

16. The computer program product of claim 13, wherein the index line address in the read request is a first index line address, and the program instructions are further executable by the memory processor of the device to cause the memory processor to:

receive a write request comprising a set of data elements, a second index line address and the start address;

retrieve the indices of the second index line address from the memory;

disassemble the data elements; and write the disassembled data elements into the data array.

17. The computer program product of claim 16, wherein the program instructions are further executable by the memory processor of the device to cause the memory processor to:

write the data elements by:

sending a write burst request to the memory device; and writing one or more data lines as data bursts to the memory device.

* * * * *